US010175947B1

United States Patent

(12) United States Patent
Marukame et al.

(10) Patent No.: US 10,175,947 B1
(45) Date of Patent: Jan. 8, 2019

(54) ARITHMETIC DEVICE

(71) Applicant: Kabushiki Kaisha Toshiba, Minato-ku (JP)

(72) Inventors: Takao Marukame, Chuo (JP); Yoshihiro Ueda, Yokohama (JP); Shinji Miyano, Yokohama (JP); Shinichi Yasuda, Setagaya (JP); Yoshifumi Nishi, Yokohama (JP); Mari Matsumoto, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/899,723

(22) Filed: Feb. 20, 2018

(30) Foreign Application Priority Data

Sep. 15, 2017 (JP) ................................ 2017-177777

(51) Int. Cl.
*G06F 7/57* (2006.01)
*G11C 13/00* (2006.01)
(Continued)

(52) U.S. Cl.
CPC ................ *G06F 7/57* (2013.01); *G06F 7/487* (2013.01); *G06F 15/7867* (2013.01); *G11C 13/004* (2013.01)

(58) Field of Classification Search
CPC ........ G06F 7/57; G06F 7/487; G06F 15/7867; G11C 13/004
(Continued)

(56) References Cited

U.S. PATENT DOCUMENTS 8,737,151 B2 5/2014 Bateman et al.
8,750,018 B2 6/2014 Youn et al.
(Continued)

FOREIGN PATENT DOCUMENTS

JP 9-101944 4/1997
JP 2013-251040 12/2013
(Continued)

OTHER PUBLICATIONS

Takao Marukame, et al. "Error Tolerance Analysis of Deep Learning Hardware Using a Restricted Boltzmann Machine Toward Low-Power Memory Implementation", IEEE Transactions on Circuits and Systems-II: Express Briefs, vol. 64, No. 4, 2017, 5 pages.

*Primary Examiner* — Tan V Mai
(74) *Attorney, Agent, or Firm* — Oblon, McClelland, Maier & Neustadt, L.L.P.

(57) ABSTRACT

According to an embodiment, an arithmetic device is configured to receive M input signals each representing a two-state value and M coefficients to output an output signal representing a two-state value. The device includes a positive-side current source, a negative-side current source, M cross switches, a coefficient memory unit, and a comparator. The positive-side current source is configured to output a first voltage corresponding to a value of 1/L of the current output from a positive-side terminal. The negative-side current source is configured to output a second voltage corresponding to a value of 1/L of the current output from a negative-side terminal. The memory unit includes M cells corresponding to the respective M coefficients. The comparator is configured to output an output signal having a value corresponding to a comparison result of the first voltage with the second voltage. Each M cell includes a first resistor and a second resistor.

12 Claims, 9 Drawing Sheets

(51) Int. Cl.
*G06F 15/78* (2006.01)
*G06F 7/487* (2006.01)

(58) Field of Classification Search
USPC .......................................................... 708/835
See application file for complete search history.

(56) References Cited

U.S. PATENT DOCUMENTS

| | | | | |
|---|---|---|---|---|
| 9,070,424 | B2 | 6/2015 | Youn et al. | |
| 2006/0092689 | A1 | 5/2006 | Braun et al. | |
| 2008/0002481 | A1* | 1/2008 | Gogl ........................ | G11C 5/02 365/189.06 |
| 2012/0011090 | A1 | 1/2012 | Tang et al. | |
| 2012/0011092 | A1 | 1/2012 | Tang et al. | |
| 2012/0016829 | A1 | 1/2012 | Snider | |
| 2013/0311413 | A1 | 11/2013 | Rose et al. | |
| 2015/0028278 | A1 | 1/2015 | Lee et al. | |
| 2015/0088797 | A1 | 3/2015 | Kim et al. | |
| 2016/0284400 | A1 | 9/2016 | Yakopcic et al. | |
| 2016/0292569 | A1 | 10/2016 | Brezzo et al. | |
| 2016/0336064 | A1 | 11/2016 | Seo et al. | |
| 2017/0017879 | A1 | 1/2017 | Kataeva et al. | |
| 2018/0082168 | A1 | 3/2018 | Marukame et al. | |
| 2018/0211154 | A1 | 7/2018 | Mori et al. | |

FOREIGN PATENT DOCUMENTS

| | | |
|---|---|---|
| JP | 2014-10885 | 1/2014 |
| JP | 2017-49945 | 3/2017 |
| JP | 2018-49887 A | 3/2018 |
| JP | 2018-120433 A | 8/2018 |

* cited by examiner

POSITIVE-SIDE CURRENT SOURCE
NEGATIVE-SIDE CURRENT SOURCE
COEFFICIENT MEMORY UNIT
Vclmp
20

$w_i \cdot x_i = I_{P\_i} - I_{N\_i}$
$= I_1 - I_2 \geq 0$
$= +1$ $w_i \cdot x_i = I_{P\_i} - I_{N\_i}$
$= I_2 - I_1 < 0$
$= -1$ POSITIVE-SIDE CURRENT SOURCE
NEGATIVE-SIDE CURRENT SOURCE
32
34
36
46
50
VDD
VGS1
VGS2
Id1
Id2
481
48L
521
52L
IP_1
IP_2
IP_M
IN_1
IN_2
IN_M
Vd
y= -1, Vd<0
+1, Vd≥0

ARITHMETIC DEVICE

CROSS-REFERENCE TO RELATED APPLICATIONS

This application is based upon and claims the benefit of priority from Japanese Patent Application No. 2017-177777, filed on Sep. 15, 2017; the entire contents of which are incorporated herein by reference.

FIELD

Embodiments described herein relate generally to an arithmetic device.

BACKGROUND

Deep learning techniques using a neural network have been known. Further, techniques of performing deep learning by using dedicated hardware have been studied.

In respective units included in the neural network, product-sum operation (multiply accumulate operation) is performed. That is, in the respective units, a coefficient is multiplied to each of a plurality of input signals received from a unit in a preceding stage, and a plurality of input signals multiplied by the coefficient are added. Further, in the respective units, the value calculated in this manner is applied to an activating function. The respective units output an output value of the activating function.

A neural network device realized by hardware needs to include a plurality of such units. Therefore, when the neural network is realized by hardware, it is desired to realize arithmetic processing in the individual unit with a simple configuration.

DETAILED DESCRIPTION

According to an embodiment, an arithmetic device is configured to receive M input signals each representing a two-state value and M coefficients corresponding respectively to the M input signals to output an output signal representing a two-state value where M is an integer larger than or equal to 2. The device includes a positive-side current source, a negative-side current source, M cross switches, a coefficient memory unit, and a comparator. The positive-side current source is configured to output a current from a positive-side terminal, and output a first voltage corresponding to a value of 1/L of the current output from the positive-side terminal where L is an integer equal to or larger than 2. The negative-side current source is configured to output a current from a negative-side terminal, and output a second voltage corresponding to a value of I/L of the current output from the negative-side terminal. The M cross switches are provided corresponding to the respective M input signals. The coefficient memory unit includes M cells corresponding to the respective M coefficients. The comparator is configured to output an output signal having a value corresponding to a comparison result of the first voltage with the second voltage. Each of the M cells includes a first resistor and a second resistor. One end of the first resistor is connected to a first terminal of a corresponding cross switch. The other end of the first resistor is connected to a first reference potential. One end of the second resistor is connected to a second terminal of a corresponding cross switch. The other end of the second resistor is connected to the first reference potential.

An arithmetic device 10 according to an embodiment is described in detail with reference to the drawings. The arithmetic device 10 according to the present embodiment realizes nonlinear operation that simulates neurons with a simple configuration.

EMBODIMENT

Figure 1:
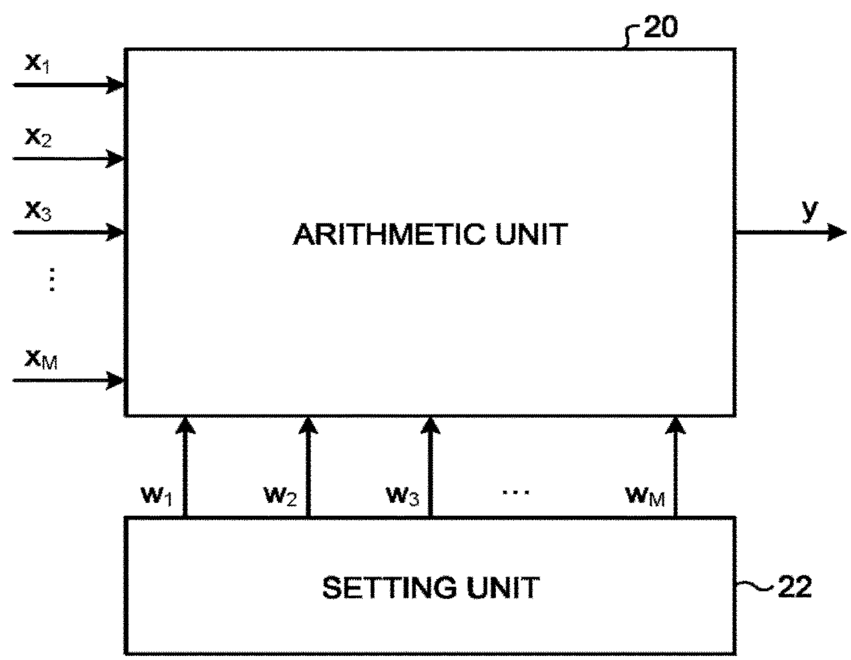
FIG. 1 is a configuration diagram of an arithmetic device according to an embodiment.

FIG. 1 is a diagram illustrating a configuration of the arithmetic device 10 according to the present embodiment. The arithmetic device 10 includes an arithmetic unit 20 and a setting unit 22.

The arithmetic unit 20 receives M input signals and M coefficients. M is an integer equal to or larger than 2. The M coefficients correspond one-to-one to the M input signals.

The setting unit 22 receives M coefficients each represented by a two-state value, for example, from an external learning device. The setting unit 22 causes the arithmetic unit 20 to memorize the M coefficients therein. The arithmetic unit 20 includes a plurality of non-volatile memory cells therein. The setting unit 22 causes the non-volatile memory cells to memorize the M coefficients.

The arithmetic unit 20 receives the M input signals each represented by a two-state value from other units. Upon reception of the M input signals, the arithmetic unit 20 performs arithmetic processing based on the received M input signals and the M coefficients memorized therein. The arithmetic unit 20 outputs an output signal represented by a two-state value as a result of performing the arithmetic processing.

In the present embodiment, the output signal is denoted by y. In the present embodiment, the M input signals are denoted by $x_1, x_2, x_3, \ldots, x_M$. In the present embodiment, the M coefficients are denoted by $w_1, w_2, w_3, \ldots, w_M$.

Subscript suffixes denote indexes. An input signal and a coefficient attached with the same index correspond to each other. That is, $x_1$ and $w_1$ correspond to each other, $x_2$ and $w_2$ correspond to each other, and $x_M$ and $w_M$ correspond to each other. An input signal with an arbitrary index is denoted by $x_i$, and a coefficient with an arbitrary index is denoted by $w_i$, where i is an integer from 1 to M.

Figure 2:
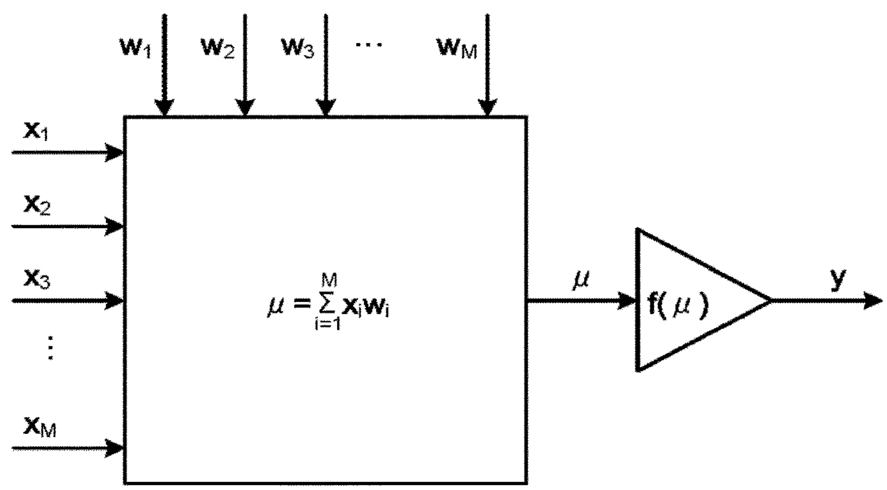
FIG. 2 is an explanatory diagram of a content of arithmetic processing performed by the arithmetic device.

FIG. 2 is an explanatory diagram of a content of arithmetic processing performed by the arithmetic device 10.

In the present embodiment, each of the M input signals represents either value of −1 or +1 as represented by the following Equation (11).

$$x_i=\{-1,+1\} \tag{11}$$

In the present embodiment, each of the M coefficients represents either value of −1 or +1 as represented by the following Equation (12).

$$w_i=\{-1,+1\} \tag{12}$$

In the present embodiment, the output signal represents either value of −1 or +1 as represented by the following Equation (13).

$$y=\{-1,+1\} \tag{13}$$

When having received M input signals, the arithmetic unit 20 performs product-sum operation (multiply accumulate operation) of the M input signals and M coefficients by analog processing. For example, the arithmetic unit 20 designates μ calculated by the following Equation (14) as an intermediate value.

$$\mu=\sum_{i=1}^{M} x_i \cdot w_i \tag{14}$$

where the dot represents multiplication.

The intermediate value represents a value accumulating M multiplication values obtained by multiplying each of the M input signals by a coefficient corresponding thereto. The arithmetic unit 20 performs sign function processing on a signal representing such an intermediate value to generate an output signal. That is, the arithmetic unit 20 performs arithmetic processing of the following Equation (15) on the signal representing the intermediate value.

$$y=f(\mu) \tag{15}$$

where f( ) denotes a sign function; y denotes a value of the output signal.

When an argument (intermediate value) is smaller than 0, the sign function is a function that outputs −1, and when the argument (intermediate value) is equal to or larger than 1, the sign function is a function that outputs +1. That is, the sign function is a function as indicated by the following Equation (16).

$$f(\mu)=\begin{cases}-1, & \mu<0\\ +1, & \mu\geq 0\end{cases} \tag{16}$$

Figure 3:
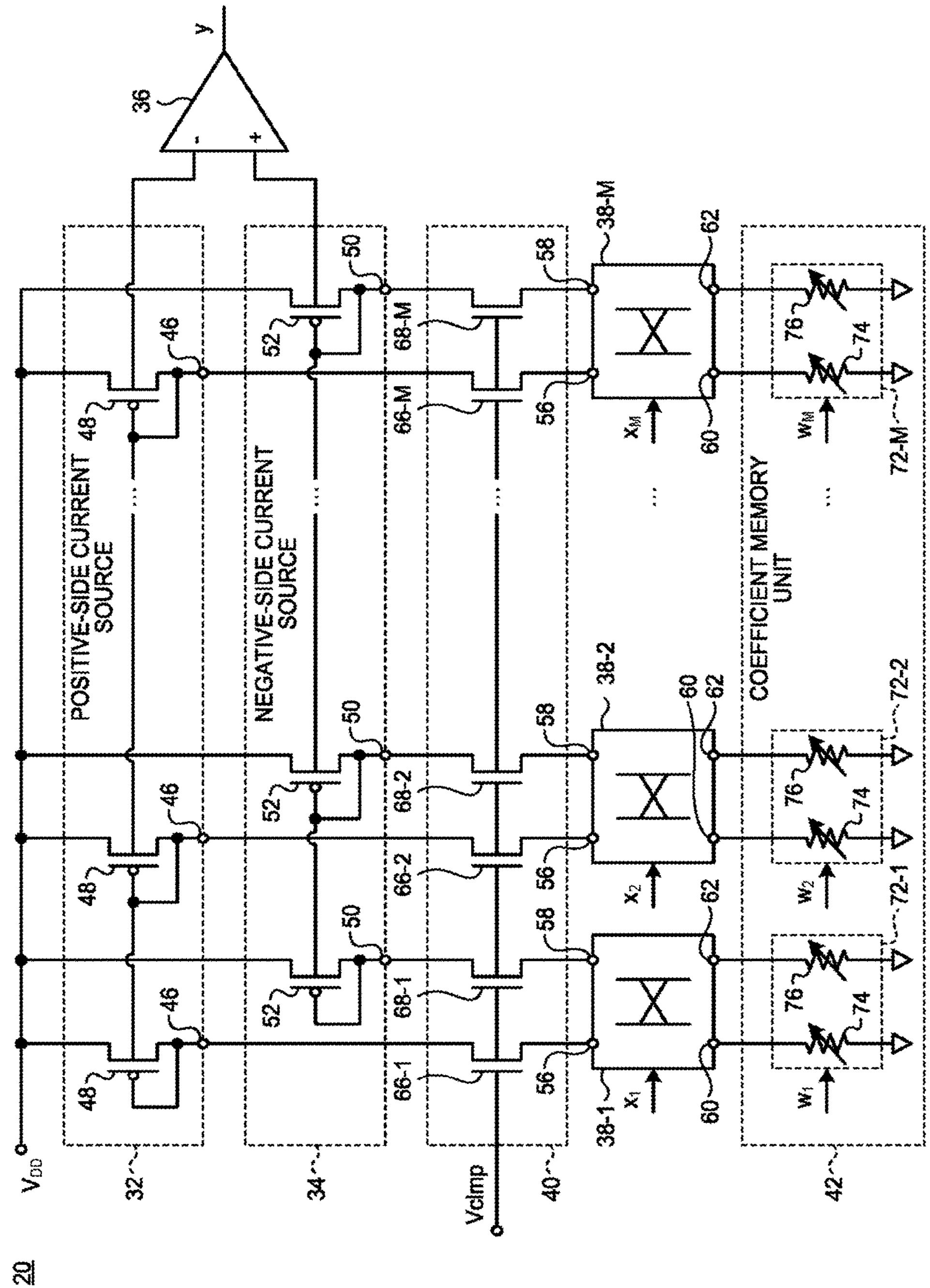
FIG. 3 is a configuration diagram of hardware of an arithmetic unit.

FIG. 3 is a diagram illustrating a hardware configuration of the arithmetic unit 20. The arithmetic unit 20 includes a positive-side current source 32, a negative-side current source 34, a comparator 36, M cross switches 38, a clamp circuit 40, and a coefficient memory unit 42.

The positive-side current source 32 includes a positive-side terminal 46. The positive-side current source 32 outputs a current from the positive-side terminal 46. The positive-side current source 32 also outputs a first voltage corresponding to a value of 1/L (L is an integer equal to or larger than 2) of the current output from the positive-side terminal 46. For example, the positive-side current source 32 outputs a first voltage proportional to a value of 1/L of the current output from the positive-side terminal 46. In the present embodiment, L=M is established. However, L does not need to be the same as M. A plurality of positive-side terminals 46 are illustrated in FIG. 3. The positive-side terminals 46 illustrated in FIG. 3 are electrically connected with each other.

For example, the positive-side current source 32 includes L first FETs 48. Each of the L first FETs 48 is a field-effect transistor having identical characteristics. In the present embodiment, each of the L first FETs 48 is a pMOS transistor having identical characteristics.

A gate of each of the L first FETs 48 is connected in common, a source thereof is connected to a second reference potential, and a drain thereof is connected to the gate and the positive-side terminal 46. The second reference potential is, for example, a positive-side power supply voltage ($V_{DD}$). That is, each of the L first FETs 48 is diode-connected, in which the source is connected to the second reference potential (for example, $V_{DD}$), and the gate and the drain are connected to the positive-side terminal 46. The positive-side current source 32 outputs a voltage of the positive-side terminal 46 (a gate voltage of the first FET 48) as a first voltage.

The negative-side current source 34 includes a negative-side terminal 50. The negative-side current source 34 outputs a current from the negative-side terminal 50. The negative-side current source 34 also outputs a second voltage corresponding to a value of 1/L of the current output from the negative-side terminal 50. For example, the negative-side current source 34 outputs a second voltage proportional to a value of 1/L of the current output from the negative-side terminal 50. A plurality of negative-side terminals 50 are illustrated in FIG. 3. The negative-side terminals 50 are electrically connected with each other.

For example, the negative-side current source 34 includes L second FETs 52. Each of the second FETs 52 is a field-effect transistor having identical characteristics as those of the first FET 48. In the present embodiment, each of the L second FETs 52 is a pMOS transistor having identical characteristics as those of the first FET 48.

A gate of each of the L second FETs 52 is connected in common, a source thereof is connected to the second reference potential, and a drain thereof is connected to the gate and the negative-side terminal 50. That is, each of the L second FETs 52 is diode-connected, in which the source is connected to the second reference potential (for example, $V_{DD}$), and the gate and the drain are connected to the negative-side terminal 50. The negative-side current source 34 outputs a voltage of the negative-side terminal 50 (a gate voltage of the second FET 52) as a second voltage.

The comparator 36 compares the magnitude between the first voltage output from the positive-side current source 32 and the second voltage output from the negative-side current source 34. The comparator 36 outputs an output signal (y) having a value corresponding to a comparison result between the first voltage and the second voltage. If the first voltage is smaller than the second voltage, the comparator 36 outputs an output signal having a first value (for example, −1). If the first voltage is equal to or larger than the second voltage, the comparator 36 outputs an output signal having a second value (for example, +1). If the first voltage is smaller than the second voltage, the comparator 36 can output an output signal having the second value (for example, +1), and if the first voltage is equal to or larger than the second voltage, the comparator 36 can output an output signal having the first value (for example, −1).

The M cross switches 38 are provided corresponding to the M input signals, respectively. In the present embodiment, the arithmetic unit 20 includes a first cross switch 38-1 to an Mth cross switch 38-M as the M cross switches 38. For example, the first cross switch 38-1 corresponds to the first input signal ($x_1$), the second cross switch 38-2 corresponds to the second input signal ($x_2$), and the Mth cross switch 38-M corresponds to the Mth input signal ($x_M$).

Each of the M cross switches 38 includes a positive-side inflow terminal 56, a negative-side inflow terminal 58, a first terminal 60, and a second terminal 62.

Each of the M cross switches 38 connects the first terminal 60 to either one of the positive-side inflow terminal 56 or the negative-side inflow terminal 58. Further, each of the M cross switches 38 connects the second terminal 62 to the other one of the positive-side inflow terminal 56 or the negative-side inflow terminal 58 that is not connected with the first terminal 60. Each of the M cross switches 38 switches over connection of the first terminal 60 and the second terminal 62 to either the positive-side inflow terminal 56 or the negative-side inflow terminal 58 according to the value of the corresponding input signal.

The clamp circuit 40 includes M positive-side FET switches 66 corresponding respectively to the M cross switches 38. In the present embodiment, the clamp circuit 40 includes a first positive-side FET switch 66-1 to an Mth positive-side FET switch 66-M as the M positive-side FET switches 66. For example, the first positive-side FET switch 66-1 corresponds to the first cross switch 38-1, the second positive-side FET switch 66-2 corresponds to the second cross switch 38-2, and the Mth positive-side FET switch 66-M corresponds to the Mth cross switch 38-M.

A gate of each of the M positive-side FET switches 66 is connected to a clamp potential ($V_{clmp}$), a source thereof is connected to the positive-side terminal 46, and a drain thereof is connected to the positive-side inflow terminal 56 of the corresponding cross switch 38. In each of the M positive-side FET switches 66, a source-drain is turned on during arithmetic operation of the arithmetic device 10. Accordingly, the positive-side inflow terminal 56 of each of the M cross switches 38 is connected to the positive-side terminal 46 of the positive-side current source 32 and the voltage is fixed to the clamp potential ($V_{clmp}$) during the arithmetic operation of the arithmetic device 10.

Further, the clamp circuit 40 includes M negative-side FET switches 68 corresponding respectively to the M cross switches 38. In the present embodiment, the clamp circuit 40 includes a first negative-side FET switch 68-1 to an Mth negative-side FET switch 68-M as the M negative-side FET switches 68. For example, the first negative-side FET switch 68-1 corresponds to the first cross switch 38-1, the second negative-side FET switch 68-2 corresponds to the second cross switch 38-2, and the Mth negative-side FET switch 68-M corresponds to the Mth cross switch 38-M.

A gate of each of the M negative-side FET switches 68 is connected to the clamp potential ($V_{clmp}$), a source thereof is connected to the negative-side terminal 50, and a drain thereof is connected to the negative-side inflow terminal 58 of the corresponding cross switch 38. In each of the M negative-side FET switches 68, a source-drain is turned on during the arithmetic operation of the arithmetic device 10. Accordingly, the negative-side inflow terminal 58 of each of the M cross switches 38 is connected to the negative-side terminal 50 of the negative-side current source 34 and the voltage is fixed to the clamp potential ($V_{clmp}$) during the arithmetic operation of the arithmetic device 10.

The coefficient memory unit 42 includes M cells 72 corresponding to each of the M coefficients. In the present embodiment, the coefficient memory unit 42 includes a first cell 72-1 to an Mth cell 72-M as the M cells 72. For example, the first cell 72-1 corresponds to the first coefficient ($w_1$), the second cell 72-2 corresponds to the second coefficient ($w_2$), and the Mth cell 72-M corresponds to the Mth coefficient ($w_M$). The first coefficient ($w_1$) corresponds to the first input signal ($x_1$), the second coefficient ($w_2$) corresponds to the second input signal ($x_2$), and the Mth coefficient ($w_M$) corresponds to the Mth input signal ($x_M$). Accordingly, for example, the first cell 72-1 corresponds to the first cross switch 38-1, the second cell 72-2 corresponds to the second cross switch 38-2, and the Mth cell 72-M corresponds to the Mth cross switch 38-M.

Each of the M cells 72 includes a first resistor 74 and a second resistor 76. One end of the first resistor 74 is connected to the first terminal 60 of the corresponding cross switch 38, and the other end is connected to a first reference potential. The first reference potential is, for example, a ground potential. One end of the second resistor 76 is connected to the second terminal 62 of the corresponding cross switch 38, and the other end is connected to the first reference potential.

At least one of the first resistor 74 and the second resistor 76 is a variable resistor such as a resistive random access memory. A magnitude relation of resistance values of the first resistor 74 and the second resistor 76 is changed according to the value of the corresponding coefficient. For example, the setting unit 22 receives the M coefficients prior to reception of the M input signals. The setting unit 22 sets the magnitude relation of the resistance values of the first resistor 74 and the second resistor 76 included in the corresponding cell 72 according to each of the received M coefficients.

For example, in each of the cells 72, when the corresponding coefficient is +1, the first resistor 74 is set to a first resistance value, the second resistor 76 is set to a second resistance value different from the first resistance value. In each of the cells 72, when the corresponding coefficient is −1, the first resistor 74 is set to the second resistance value, and the second resistor 76 is set to the first resistance value.

In each of the cells 72, one of the first resistor 74 and the second resistor 76 can be a fixed resistor, and the other can be a variable resistor. In this case, in each of the cells 72, a resistance value of the variable resistor is changed so that plus and minus of a resistance difference between the first resistor 74 and the second resistor 76 is reversed, in the case where the corresponding coefficient is +1 and in the case where the corresponding coefficient is −1.

Each of the M cross switches 38 switches over whether to connect the first terminal 60 and the second terminal 62 to the positive-side terminal 46 (the positive-side inflow terminal 56) and the negative-side terminal 50 (the negative-side inflow terminal 58) by straight connection or reverse connection according to the value of the corresponding input signal.

For example, in the case of straight connection, each of the M cross switches 38 connects the first terminal 60 to the positive-side terminal 46 (the positive-side inflow terminal 56) and connects the second terminal 62 to the negative-side terminal 50 (the negative-side inflow terminal 58). Further, in the case of reverse connection, each of the M cross switches 38 connects the first terminal 60 to the negative-side terminal 50 (the negative-side inflow terminal 58) and connects the second terminal 62 to the positive-side terminal 46 (the positive-side inflow terminal 56).

For example, when the value of the corresponding input signal is +1, each of the M cross switches 38 performs straight connection, and when the value of the corresponding input signal is −1, each of the M cross switches 38 performs reverse connection. Alternatively, when the value of the corresponding input signal is +1, each of the M cross switches 38 can perform reverse connection, and when the value of the corresponding input signal is −1, each of the M cross switches 38 can perform straight connection.

Figure 4:
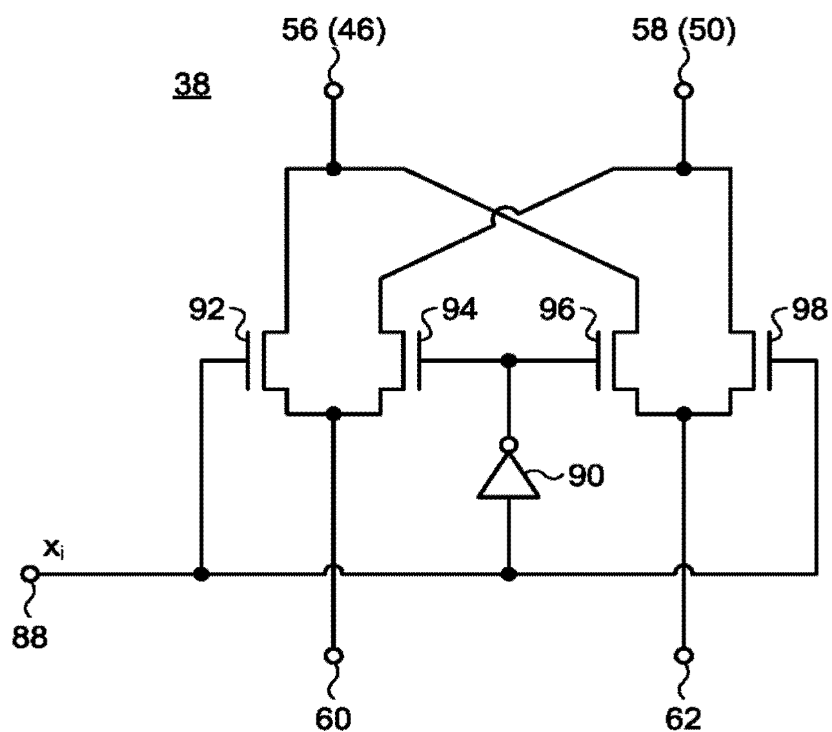
FIG. 4 is a configuration diagram of a cross switch.

FIG. 4 is a diagram illustrating an example of a configuration of the cross switch 38. For example, the cross switch 38 includes the positive-side inflow terminal 56, the negative-side inflow terminal 58, the first terminal 60, the second terminal 62, an input terminal 88, a reverse circuit 90, a positive-side first FET 92, a negative-side first FET 94, a positive-side second FET 96, and a negative-side second FET 98.

The input terminal 88 receives a corresponding input signal ($x_i$). For example, when the value of the input signal ($x_i$) is −1, the input terminal 88 has an L-level voltage, and when the value of the input signal ($x_i$) is +1, the input terminal 88 has an H-level voltage. The reverse circuit 90 reverses the voltage level of the input terminal 88.

A gate of the positive-side first FET 92 is connected to the input terminal 88, a source thereof is connected to the positive-side inflow terminal 56, and a drain thereof is connected to the first terminal 60. A gate of the negative-side first FET 94 is connected to an output terminal of the reverse circuit 90, a source thereof is connected to the negative-side inflow terminal 58, and a drain thereof is connected to the first terminal 60. A gate of the positive-side second FET 96 is connected to the output terminal of the reverse circuit 90, a source thereof is connected to the positive-side inflow terminal 56, and a drain thereof is connected to the second terminal 62. A gate of the negative-side second FET 98 is connected to the input terminal 88, a source thereof is connected to the negative-side inflow terminal 58, and a drain thereof is connected to the second terminal 62. Each of the positive-side first FET 92, the negative-side first FET 94, the positive-side second FET 96, and the negative-side second FET 98 is, for example, an nMOSFET.

In the cross switch 38 having such configurations, when the value of the input signal ($x_i$) is +1 (the input terminal 88 has an H-level voltage), the positive-side first FET 92 is on, the negative-side first FET 94 is off, the positive-side second FET 96 is off, and the negative-side second FET 98 is on. Therefore, in this case, the cross switch 38 connects the first terminal 60 to the positive-side inflow terminal 56 (the positive-side terminal 46) and connects the second terminal 62 to the negative-side inflow terminal 58 (the negative-side terminal 50) (straight connection).

In the cross switch 38 having such configurations, when the value of the input signal ($x_i$) is −1 (the input terminal 88 has an L-level voltage), the positive-side first FET 92 is off, the negative-side first FET 94 is on, the positive-side second FET 96 is on, and the negative-side second FET 98 is off. Therefore, in this case, the cross switch 38 connects the first terminal 60 to the negative-side inflow terminal 58 (the negative-side terminal 50) and connects the second terminal 62 to the positive-side inflow terminal 56 (the positive-side terminal 46) (reverse connection).

Figure 5:
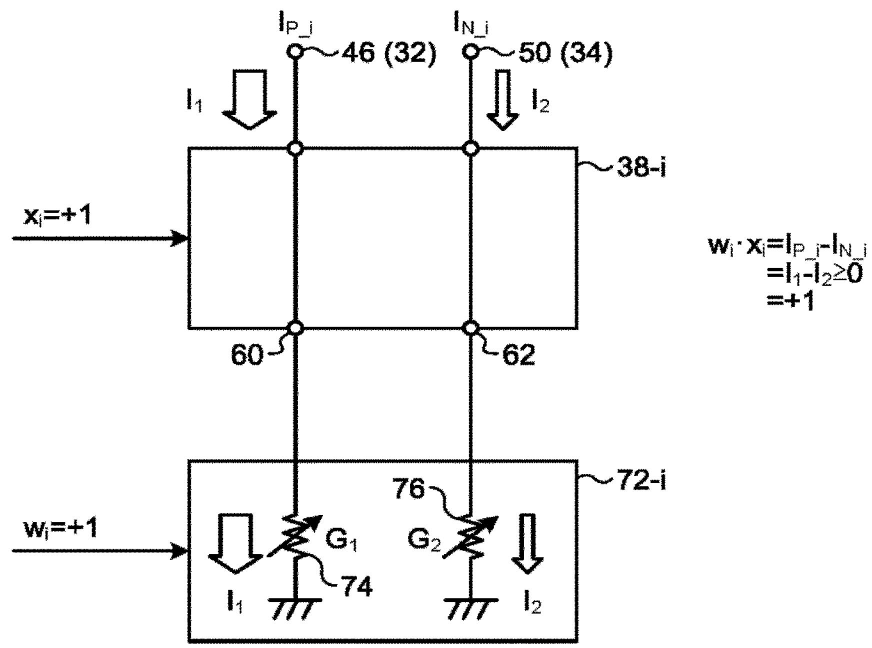
FIG. 5 is an explanatory diagram of arithmetic operation in a case of $w_i$=+1 and $x_i$=+1.

FIG. 5 is an explanatory diagram of arithmetic operation of the arithmetic unit 20 in a case of $w_i=+1$ and $x_i=+1$. When an ith coefficient ($w_i$) is +1, the first resistor 74 of an ith cell 72-*i* is set to a first conductance ($G_1=1/R_1$). When the first coefficient ($w_i$) is +1, the second resistor 76 of the ith cell 72-*i* is set to a second conductance ($G_2=1/R_2$). In this case, a current having a first current value ($I_1$) flows to the first resistor 74. Further, a current having a second current value ($I_2$) flows to the second resistor 76. It is assumed that $G_1>G_2$ is established. Therefore, $I_1>I_2$ is established.

When an ith input signal ($x_i$) is +1, an ith cross switch 38-*i* is straight-connected. Therefore, the positive-side terminal 46 of the positive-side current source 32 supplies a current to the first resistor 74 of the ith cell 72-*i*. Further, the negative-side terminal 50 of the negative-side current source 34 supplies a current to the second resistor 76 of the ith cell 72-*i*.

At this time, the arithmetic unit 20 expresses a calculation result of a value ($w_i \cdot x_i$) obtained by multiplying the ith coefficient ($w_i$) by the ith input signal ($x_i$) by a current difference ($I_{P\_i}-I_{N\_i}$) between a current ($I_{P\_i}$) flowing from the positive-side terminal 46 to the ith cell 72-*i* and a current ($I_{N\_i}$) flowing from the negative-side terminal 50 to the ith cell 72-*i*.

Accordingly, in the example illustrated in FIG. 5, $I_{P\_1}=I_1$ and $I_{N\_i}=I_2$ are established, and the current difference ($I_{P\_i}-I_{N\_i}$) has a positive value. Therefore, in the case of $w_i=+1$ and $x_i=+1$, the arithmetic unit 20 can derive +1 as a value ($w_i \cdot x_i$) obtained by multiplying the ith coefficient ($w_i$) by the ith input signal ($x_i$).

Figure 6:
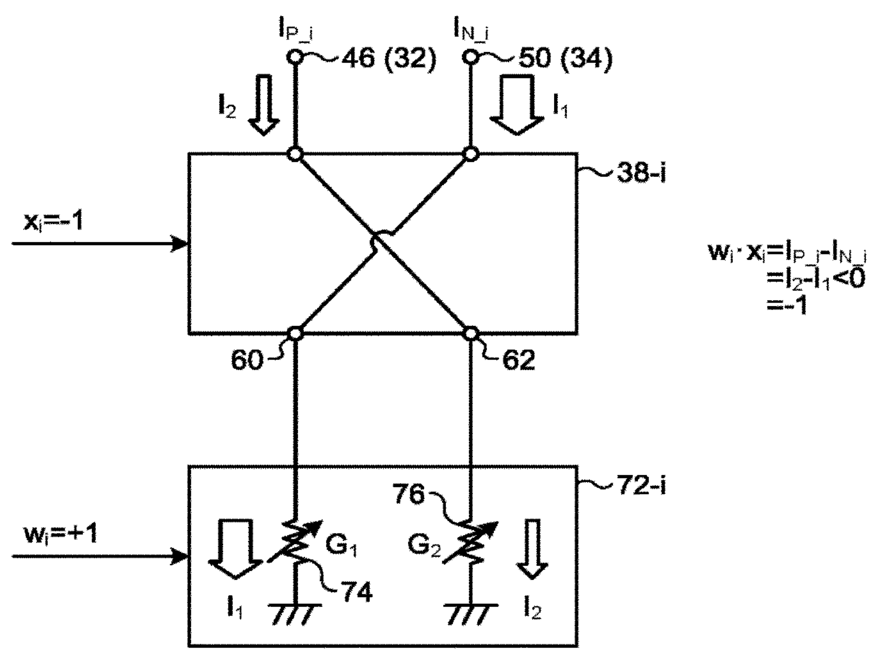
FIG. 6 is an explanatory diagram of arithmetic operation in a case of $w_i$=+1 and $x_i$=−1.

FIG. 6 is an explanatory diagram of arithmetic operation of the arithmetic unit 20 in a case of $w_i=+1$ and $x_i=-1$. When the ith coefficient ($w_i$) is +1, the first resistor 74 of the ith cell 72-*i* is set to the first conductance ($G_1$). When the ith coefficient ($w_i$) is +1, the second resistor 76 of the ith cell 72-*i* is set to the second conductance ($G_2$). In this case, a current having the first current value ($I_1$) flows to the first resistor 74. Further, a current having the second current value ($I_2$) flows to the second resistor 76.

Further, when the ith input signal ($x_i$) is −1, the ith cross switch 38-*i* is reverse-connected. Therefore, the positive-side terminal 46 of the positive-side current source 32 supplies a current to the second resistor 76 of the ith cell 72-*i*. Further, the negative-side terminal 50 of the negative-side current source 34 supplies a current to the first resistor 74 of the ith cell 72-*i*.

Accordingly, in the example illustrated in FIG. 6, $I_{P\_i}=I_2$ and $I_N i=I_1$ are established, and the current difference ($I_{P\_i}-I_{N\_i}$) has a negative value. Therefore, in the case of $w_i=+1$ and $x_i=-1$, the arithmetic unit 20 can derive −1 as the value ($w_i \cdot x_i$) obtained by multiplying the ith coefficient ($w_i$) by the ith input signal ($x_i$).

Figure 7:
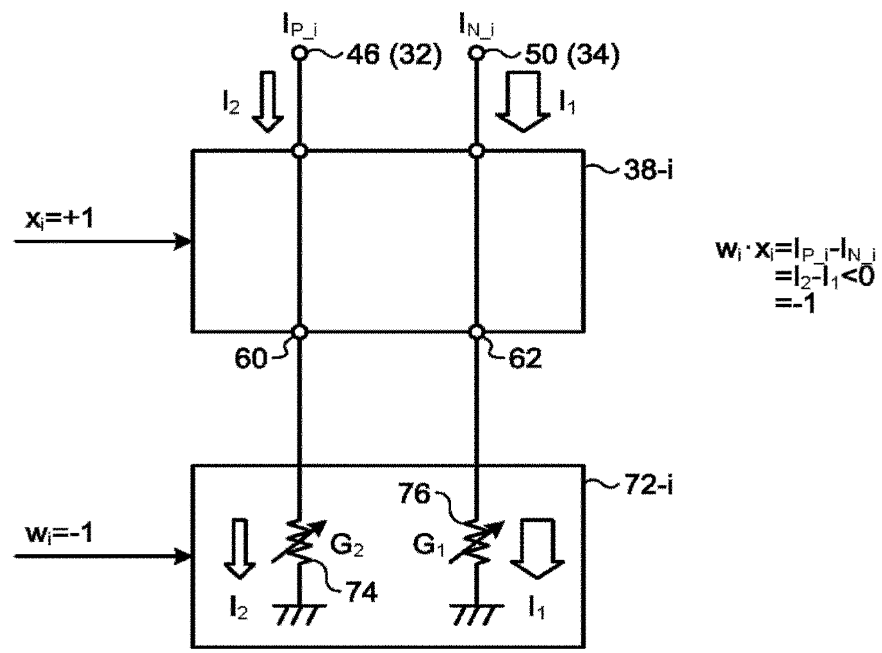
FIG. 7 is an explanatory diagram of arithmetic operation in a case of $w_i$=−1 and $x_i$=+1.

FIG. 7 is an explanatory diagram of arithmetic operation of the arithmetic unit 20 in a case of $w_i=-1$ and $x_i=+1$. When the ith coefficient ($w_i$) is −1, the first resistor 74 of the ith cell 72-*i* is set to the second conductance ($G_2$). When the ith coefficient ($w_i$) is −1, the second resistor 76 of the ith cell 72-*i* is set to the first conductance ($G_1$). Therefore, in this case, a current having the second current value ($I_2$) flows to the first resistor 74. Further, current having the first current value ($I_1$) flows to the second resistor 76.

Further, when the ith input signal ($x_i$) is +1, the ith cross switch 38-*i* is straight-connected. Therefore, the positive-side terminal 46 of the positive-side current source 32 supplies a current to the first resistor 74 of the ith cell 72-*i*. Further, the negative-side terminal 50 of the negative-side current source 34 supplies a current to the second resistor 76 of the ith cell 72-*i*.

Accordingly, in the example illustrated in FIG. 7, $I_{P\_i}=I_2$ and $I_{N\_i}=I_1$ are established, and the current difference ($I_{P\_i}-I_{N\_i}$) has a negative value. Therefore, in the case of $w_i=-1$ and $x_i=+1$, the arithmetic unit 20 can derive −1 as the value ($w_i \cdot x_i$) obtained by multiplying the ith coefficient ($w_i$) by the ith input signal ($x_i$).

Figure 8:
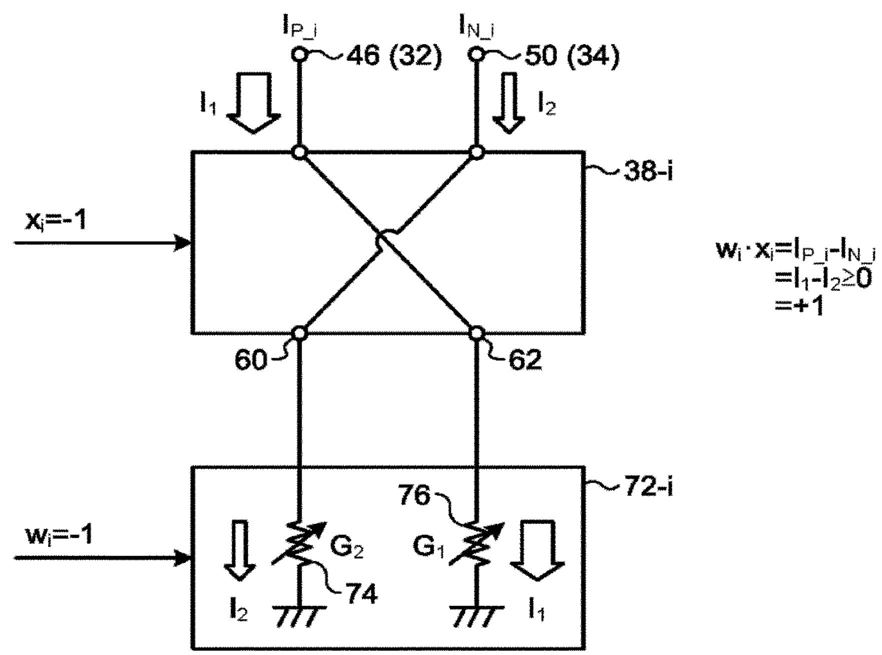
FIG. 8 is an explanatory diagram of arithmetic operation in a case of $w_i$=−1 and $x_i$=−1.

FIG. 8 is an explanatory diagram of arithmetic operation of the arithmetic unit 20 in a case of $w_i$=−1 and $x_i$=−1. When the ith coefficient ($w_i$) is −1, the first resistor 74 of the ith cell 72-*i* is set to the second conductance ($G_2$). When the ith coefficient ($w_i$) is −1, the second resistor 76 of the ith cell 72-*i* is set to the first conductance ($G_1$). Therefore, in this case, a current having the second current value ($I_2$) flows to the first resistor 74. Further, a current having the first current value ($I_1$) flows to the second resistor 76.

Further, when the ith input signal ($x_i$) is −1, the ith cross switch 38-*i* is reverse-connected. Therefore, the positive-side terminal 46 of the positive-side current source 32 supplies a current to the second resistor 76 of the ith cell 72-*i*. Further, the negative-side terminal 50 of the negative-side current source 34 supplies a current to the first resistor 74 of the ith cell 72-*i*.

Accordingly, in the example illustrated in FIG. 8, $I_E$ i=$I_1$ and $I_{N\_i}$=12 are established, and the current difference ($I_{P\_i}$−$I_{N\_i}$) has a positive value. Therefore, in the case of $w_i$=−1 and $x_i$=−1, the arithmetic unit 20 can derive +1 as the value ($w_i \cdot x_i$) obtained by multiplying the ith coefficient ($w_i$) by the ith input signal ($x_i$).

As descried above, the difference ($I_{P\_i}$−$I_{N\_i}$) between the current ($I_{P\_i}$) flowing from the positive-side terminal 46 to the ith cell 72-*i* and the current ($I_{N\_i}$) flowing from the negative-side terminal 50 to the ith cell 72-*i* represents a multiplication value ($w_i \cdot x_i$) of the ith coefficient ($w_i$) and the ith input signal ($x_i$). Therefore, a difference value {($I_{P\_1}$+$I_{P\_2}$+ . . . +$I_{P\_M}$)−($I_{N\_1}$+$I_{N\_2}$+ . . . +$I_{N\_M}$)} between a total current ($I_{P\_1}$+$I_{P\_2}$+ . . . +$I_{P\_M}$) output from the positive-side terminal 46 of the positive-side current source 32 and a total current ($I_N$ 1+$I_N$ 2+ . . . +$I_N$ M) output from the negative-side terminal 50 of the negative-side current source 34 represents a product-sum operation (multiply accumulate operation) result of M input signals and M coefficients.

Figure 9:
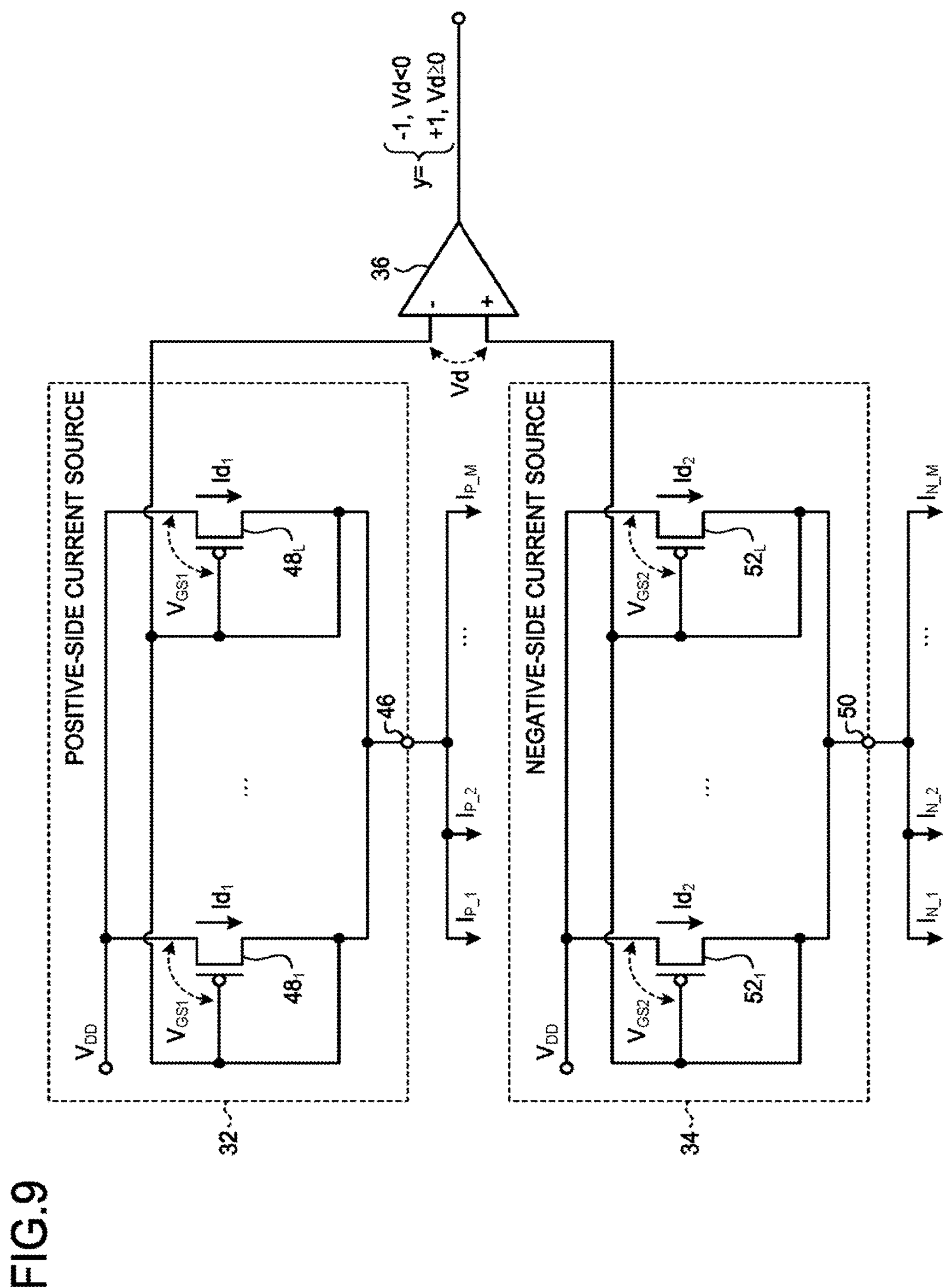
FIG. 9 is an explanatory diagram of operations of a positive-side current source, a negative-side current source, and a comparator.

FIG. 9 is an explanatory diagram of operations of the positive-side current source 32, the negative-side current source 34, and the comparator 36.

The positive-side current source 32 outputs a current of $I_{P\_1}$ to the first cell 72-1. The positive-side current source 32 also outputs a current of $I_{P\_2}$ to the second cell 72-2. The positive-side current source 32 outputs a current of $I_{P\_M}$ to the Mth cell 72-M. Therefore, the positive-side current source 32 outputs a current of $I_{P\_1}$+$I_{P\_2}$+ . . . +$I_{P\_M}$ from the positive-side terminal 46.

Further, the positive-side current source 32 includes L first FETs 48. The L first FETs 48 have identical characteristics and have identical connection relation. Accordingly, the L first FETs 48 cause an identical drain current ($Id_1$) to flow.

The total of the drain currents ($Id_1$) of the L first FETs 48 is L×$Id_1$. All the drain currents ($Id_1$) of the L first FETs 48 are supplied to the positive-side terminal 46. Accordingly, L×$Id_1$=($I_{P\_1}$+$I_{P\_2}$+ . . . +$I_{P\_M}$) is established. That is, the respective drain current ($Id_1$) of the L first FETs 48 becomes ($I_{P\_1}$+$I_{P\_2}$+ . . . +$I_{P\_M}$)/L.

The negative-side current source 34 outputs a current of $I_{N\_1}$ to the first cell 72-1. The negative-side current source 34 outputs a current of $I_{N\_2}$ to the second cell 72-2. The negative-side current source 34 also outputs a current of $I_{N\_M}$ to the Mth cell 72-M. Therefore, the negative-side current source 34 outputs a current of $I_{N\_1}$+$I_{N\_2}$+ . . . +$I_{N\_M}$ from the negative-side terminal 50.

The negative-side current source 34 includes L second FETs 52. The L second FETs 52 have identical characteristics and have identical connection relation. Accordingly, the L second FETs 52 cause an identical drain current ($Id_2$) to flow.

The total of the drain currents ($Id_2$) of the L second FETs 52 is L×$Id_2$. All the drain currents ($Id_2$) of the L second FETs 52 are supplied to the negative-side terminal 50. Accordingly, L×$Id_2$=($I_{N\_1}$+$I_{N\_2}$+ . . . +$I_{N\_M}$) is established. That is, the respective drain current ($Id_2$) of the L second FETs 52 becomes ($I_{N\_1}$+$I_{N\_2}$+ . . . +$I_{N\_M}$)/L.

The positive-side current source 32 outputs a voltage generated at the positive-side terminal 46 as a first voltage. The voltage generated at the positive-side terminal 46 has a potential obtained by subtracting a gate-source voltage ($V_{GS1}$) of the first FET 48 from the second reference potential (for example, $V_{DD}$).

The negative-side current source 34 outputs a voltage generated at the negative-side terminal 50 as a second voltage. The voltage generated at the negative-side terminal 50 has a potential obtained by subtracting a gate-source voltage ($V_{GS2}$) of the second FET 52 from the second reference potential (for example, $V_{DD}$).

The comparator 36 determines whether a difference (Vd) between the first voltage and the second voltage is smaller than 0 or equal to or larger than 0. For example, if the difference (Vd) between the first voltage and the second voltage is smaller than 0, the comparator 36 outputs a first value (for example, −1), and if the difference (Vd) between the first voltage and the second voltage is equal to or larger than 0, the comparator 36 outputs a second value (for example, +1).

The difference (Vd) between the first voltage and the second voltage is equal to a voltage obtained by subtracting the gate-source voltage ($V_{GS2}$) of the second FET 52 from the gate-source voltage ($V_{GS1}$) of the first FET 48.

The gate-source voltage ($V_{GS1}$) of the first FET 48 has a value proportional to the drain current ($Id_1$) of the first FET 48. Further, the gate-source voltage ($V_{GS2}$) of the second FET 52 has a value proportional to the drain current ($Id_2$) of the second FET 52. The first FET 48 and the second FET 52 have identical characteristics. Therefore, the difference (Vd) between the first voltage and the second voltage is proportional to the current obtained by subtracting the drain current (($I_{N\_1}$+$I_{N\_2}$+ . . . +$I_{N\_M}$)/L) of the second FETs 52 from the drain current (($I_{P\_1}$+$I_{P\_2}$+ . . . +$I_{P\_M}$)/L) of the first FETs 48.

From the above descriptions, the output signal (y) represents whether the current obtained by subtracting the drain current (($I_{N\_1}$+$I_{N\_2}$+ . . . +$I_{N\_M}$)/L) of the second FETs 52 from the drain current (($I_{P\_1}$+$I_{P\_2}$+ . . . +$I_{P\_M}$)/L) of the first FETs 48 is smaller than 0 or equal to or larger than 0.

At this time, the number (L) of the first FETs 48 provided in the positive-side current source 32 and the number (L) of the second FETs 52 provided in the negative-side current source 34 are the same. Further, the comparator 36 reverses the value, designating 0 as a threshold. A 0-cross point of the current obtained by subtracting the drain current (($I_{N\_1}$+$I_{N\_2}$+ . . . +$I_{N\_M}$)/L) of the second FETs 52 from the drain current (($I_{P\_1}$+$I_{P\_2}$+ . . . +$I_{P\_M}$)/L) of the first FETs 48, and a 0-cross point of the current obtained by subtracting the total current ($I_{N\_1}$+$I_{N\_2}$+ . . . +$I_{N\_M}$) output from the negative-side terminal 50 from the total current ($I_{P\_1}$+$I_{P\_2}$+ . . . +$I_{P\_M}$) output from the positive-side terminal 46 are the same. Therefore, the output signal (y) represents whether the current obtained by subtracting the total current ($I_{N\_1}$+$I_{N\_2}$+ . . . +$I_{N\_M}$) output from the negative-side terminal 50 from the total current ($I_{P\_1}$+$I_{P\_2}$+ . . . +$I_{P\_M}$) output from the positive-side terminal 46 is smaller than 0 or equal to or larger than 0.

A difference ($I_{P\_i}$−$I_{N\_i}$) between the current ($I_{P\_i}$) output from the positive-side terminal 46 to the ith cell 72-*i* and the current ($I_{N\_i}$) output from the negative-side terminal 50 to the ith cell 72-*i* represents a multiplication value ($w_i \cdot x_i$) of the ith coefficient ($w_i$) and the ith input signal ($x_i$). The current obtained by subtracting the total current ($I_{N\_1}+I_{N\_2}+\ldots+I_{N\_M}$) output from the negative-side terminal 50 from the total current ($I_{P\_1}+I_{P\_2}+\ldots+I_{P\_M}$) output from the positive-side terminal 46 represents a product-sum operation (multiply accumulate operation) value of M input signals and M coefficients.

Therefore, the output signal (y) represents whether the product-sum operation (multiply accumulate operation) value of M input signals and M coefficients is smaller than 0 or equal to or larger than 0.

As described above, the arithmetic device 10 according to the present embodiment can perform product-sum operation (multiply accumulate operation) of M input signals and M coefficients by analog processing. The arithmetic device 10 can generate an output signal by performing sign function processing on a signal corresponding to the multiply accumulate operation value. Particularly, the arithmetic device 10 can decrease a dynamic range of a difference voltage input to the comparator 36. Therefore, the arithmetic device 10 can perform arithmetic operation by using the comparator 36 having a simple configuration. Accordingly, the arithmetic device 10 can realize a nonlinear operation that simulates neurons with a simple configuration.

Modification

Figure 10:
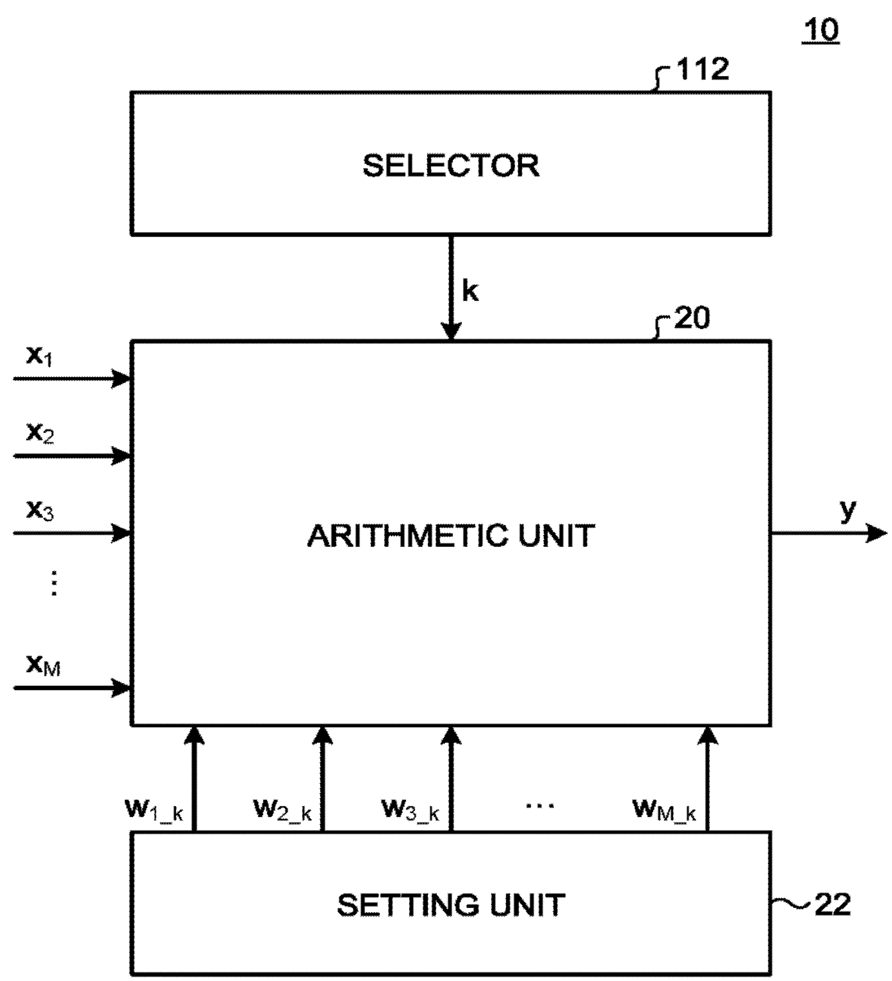
FIG. 10 is a configuration diagram of an arithmetic device according to a modification.

FIG. 10 is a diagram illustrating a configuration of the arithmetic device 10 according to a modification. The arithmetic device 10 according to the modification further includes a selector 112.

In the modification, the arithmetic unit 20 memorizes therein M coefficients for each of first to Nth word addresses (N is an integer equal to or larger than 2). For example, the arithmetic unit 20 memorizes therein M coefficients $w_{1\_1}$, $w_{2\_1}$, $w_{3\_1}$, . . . , $w_{M\text{-}1}$ in association with the first word address. For example, the arithmetic unit 20 also memorizes therein M coefficients $w_{1\_2}$, $w_{2\_2}$, $w_{3\_2}$, . . . , $w_{M\text{-}2}$ in association with the second word address. Further, for example, the arithmetic unit 20 memorizes therein M coefficients $w_{1\_k}$, $w_{2\_k}$, $w_{3\_k}$, . . . , $w_{M\_k}$ in association with the kth word address (k is an arbitrary integer from 1 to N).

The setting unit 22 receives M coefficients, for example, for each word address, for example, from an external learning device. The setting unit 22 then causes the arithmetic unit 20 to memorize therein the M coefficients for each word address.

The selector 112 selects any one of N word addresses at the time of performing the arithmetic operation. Upon reception of M input signals, the arithmetic unit 20 performs the product-sum operation (multiply accumulate operation) of the M input signals and the M coefficients at the selected word address by analog processing. The arithmetic unit 20 performs sign function processing on the signal corresponding to the multiply accumulate operation value to generate an output signal.

Figure 11:
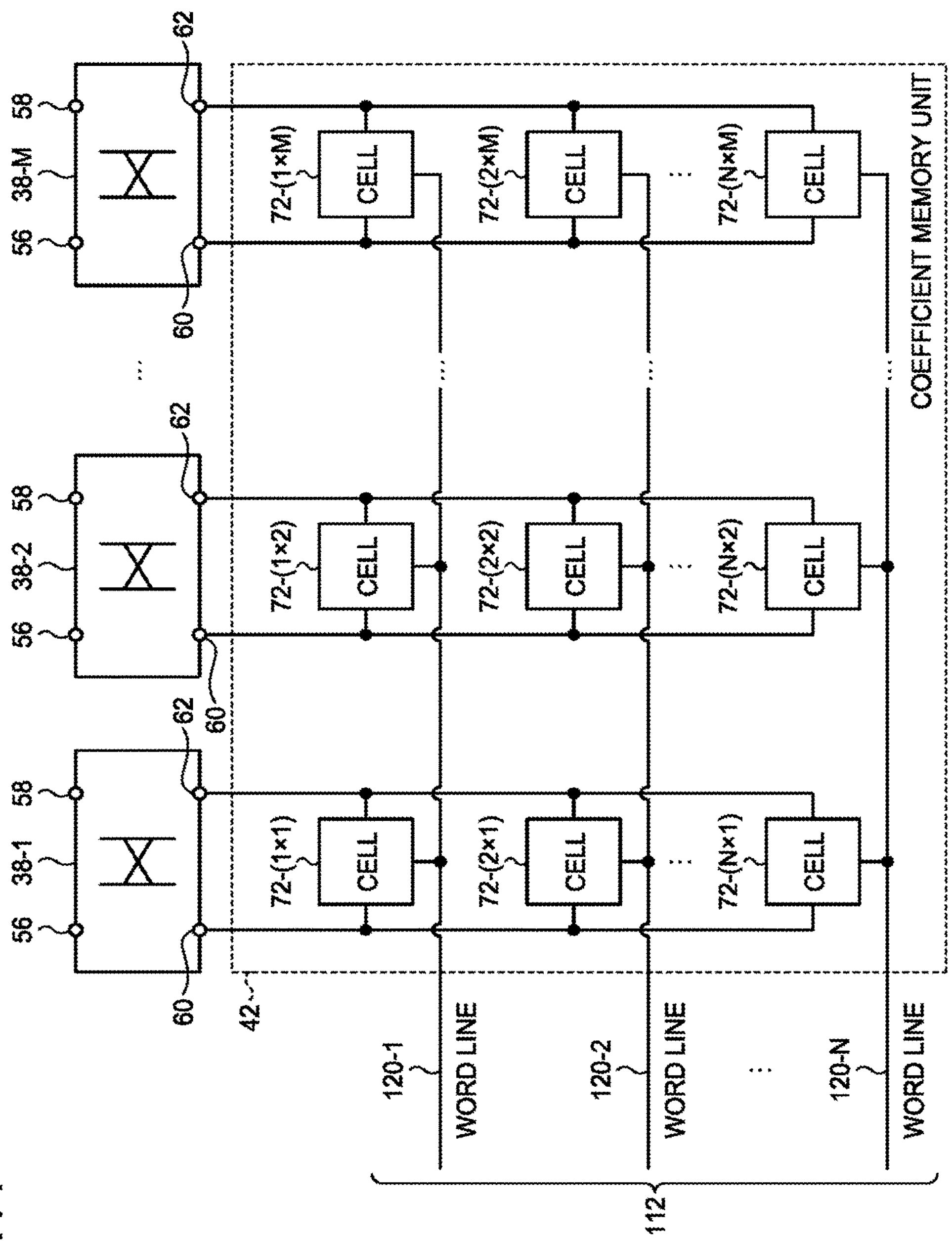
FIG. 11 is a configuration diagram of a coefficient memory unit according to the modification.

FIG. 11 is a diagram illustrating a configuration of the coefficient memory unit 42 according to the modification together with the M cross switches 38. The coefficient memory unit 42 includes M cells 72 for N sets corresponding to each of the N word addresses. That is, the coefficient memory unit 42 includes (M×N) cells 72. The (M×N) cells 72 are arranged in a matrix of M columns×N rows.

The coefficient memory unit 42 according to the modification includes N word lines 120 (120-1 to 120-N). Each of the N word lines 120 corresponds to each of the word addresses. The M cells 72 arranged in the first row are connected to the first word line 120-1. The M cells 72 arranged in the second row are connected to the second word line 120-2. The M cells 72 arranged in an arbitrary jth row (j is an integer from 1 to N) are connected to the jth word line 120-*j*. The selector 112 sets the word line 120 corresponding to the selected word address to an H-level voltage, and sets the other word liens 120 to an L-level voltage.

The M cells 72 arranged in each row correspond to the first to Mth coefficients ($w_1$ to $w_M$). The first cells 72-1 arranged in each row correspond to the first coefficient ($w_1$), the second cells 72-2 correspond to the second coefficient ($w_2$), and the Mth cells 72-M correspond to the Mth coefficient ($w_M$). Further, the first cells 72-1 arranged in each row correspond to the first cross switch 38-1, the second cells 72-2 correspond to the second cross switch 38-2, and the Mth cells 72-M correspond to the Mth cross switch 38-M.

The first cells 72-1 arranged in each row are connected to the first terminal 60 and the second terminal 62 of the corresponding cross switch 38. That is, the first cells 72-1 arranged in each row are connected to the first terminal 60 and the second terminal 62 of the first cross switch 38-1. The second cells 72-2 are connected to the first terminal 60 and the second terminal 62 of the second cross switch 38-2. The Mth cells 72-M are connected to the first terminal 60 and the second terminal 62 of the Mth cross switch 38-M.

Figure 12:
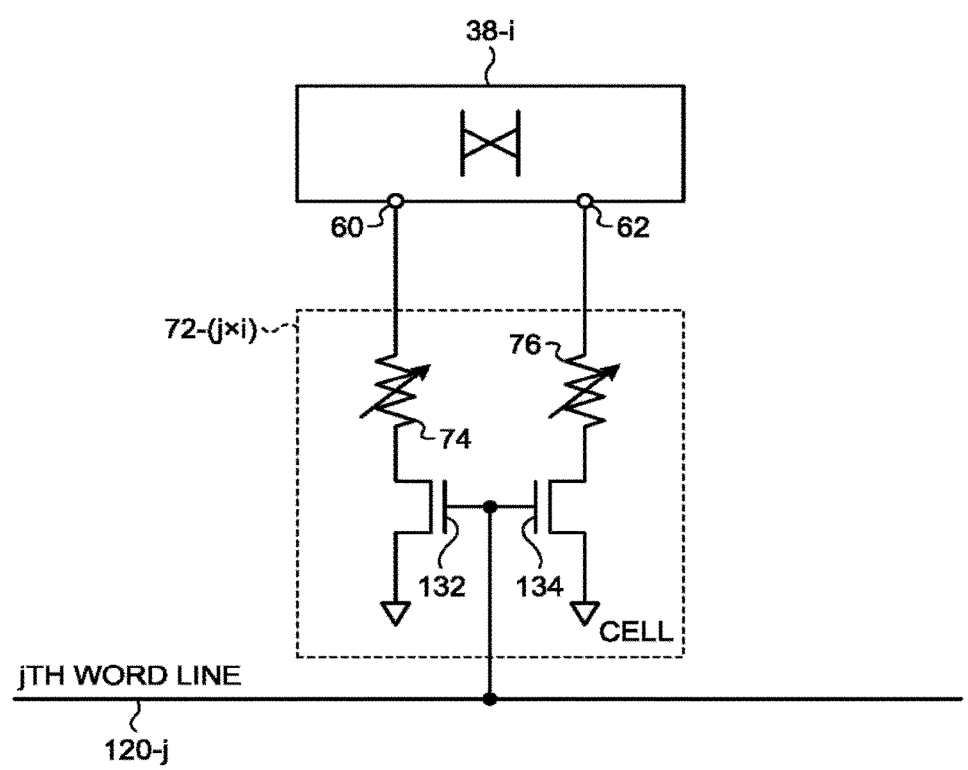
FIG. 12 is a configuration diagram of a cell according to the modification.

FIG. 12 is a diagram illustrating a configuration of a cell 72-(*j*×*i*) arranged in an arbitrary row (jth row) and an arbitrary column (ith column). The cell 72-(*j*×*i*) includes the first resistor 74, the second resistor 76, a first switch 132, and a second switch 134.

One end of the first resistor 74 is connected to the first terminal 60 of the corresponding cross switch 38 (the ith cross switch 38-*i*), and the other end thereof is connected to the first reference potential (ground) via the first switch 132. One end of the second resistor 76 is connected to the second terminal 62 of the corresponding cross switch 38 (the ith cross switch 38-*i*), and the other end thereof is connected to the first reference potential (ground) via the second switch 134.

The first switch 132 connects between the first resistor 74 and the first reference potential in a case where the corresponding word line 120 (the jth word line 120-*j*) has an H-level voltage, and disconnects the first resistor 74 and the first reference potential from each other in a case where the corresponding word line 120 has an L-level voltage. For example, the first switch 132 is an nMOSFET, in which a source thereof is connected to the first resistor 74, a drain thereof is connected to the first reference potential, and a gate thereof is connected to the corresponding word line 120 (the jth word line 120-*j*).

The second switch 134 connects between the second resistor 76 and the first reference potential in a case where the corresponding word line 120 (the jth word line 120-*j*) has an H-level voltage, and disconnects the second resistor 76 and the first reference potential from each other in a case where the corresponding word line 120 has an L-level voltage. For example, the second switch 134 is an nMOSFET, in which a source thereof is connected to the second resistor 76, a drain thereof is connected to the first reference potential, and a gate thereof is connected to the corresponding word line 120 (the jth word line 120-*j*).

When having selected the jth word address, the selector 112 sets the jth word line 120-*j* to an H-level voltage, and sets the word lines 120 other than the jth word line 120-*j* to an L-level voltage. Accordingly, the selector 112 can connect the first switch 132 and the second switch 134 with each other included in the cell 72 corresponding to the selected word address. Further, the selector 112 can disconnect the first switch 132 and the second switch 134 from each other in other cells 72.

The first switch 132 can switch over connection or disconnection between the first resistor 74 and the first terminal 60. Further, the second switch 134 can switch over connection or disconnection between the second resistor 76 and the second terminal 62.

According to the arithmetic device 10 of the modification, M coefficients to be multiplied by the M input signals can be changed. Accordingly, operations of a plurality of units included in, for example, a neural network can be performed in a time division manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An arithmetic device configured to receive M input signals each representing a two-state value and M coefficients corresponding respectively to the M input signals to output an output signal representing a two-state value where M is an integer larger than or equal to 2, the device comprising:

a positive-side current source configured to output a current from a positive-side terminal, and output a first voltage corresponding to a value of 1/L of the current output from the positive-side terminal where L is an integer equal to or larger than 2;

a negative-side current source configured to output a current from a negative-side terminal, and output a second voltage corresponding to a value of 1/L of the current output from the negative-side terminal;

M cross switches that are provided corresponding to the respective M input signals;

a coefficient memory unit including M cells corresponding to the respective M coefficients; and a comparator configured to output an output signal having a value corresponding to a comparison result of the first voltage with the second voltage, each of the M cells includes a first resistor and a second resistor, one end of the first resistor is connected to a first terminal of a corresponding cross switch, the other end of the first resistor is connected to a first reference potential, one end of the second resistor is connected to a second terminal of a corresponding cross switch, and the other end of the second resistor is connected to the first reference potential.

2. The device according to claim 1, wherein a magnitude relation of resistance values of the first resistor and the second resistor is changed according to a value of a corresponding coefficient, and each of the M cross switches switches over whether to connect the first terminal and the second terminal to the positive-side terminal and the negative-side terminal by straight connection or reverse connection according to a value of a corresponding input signal.

3. The device according to claim 2, further comprising a setting unit configured to receive the M coefficients, each representing a two-state value, prior to reception of the M input signals, and set a magnitude relation of resistance values of the first resistor and the second resistor included in a corresponding cell according to a corresponding one of the received M coefficients.

4. The device according to claim 2, wherein either one of the first resistor and the second resistor is set to a first resistance value according to a value of a corresponding coefficient, and the other resistor is set to a second resistance value different from the first resistance value.

5. The device according to claim 2, wherein one of the first resistor and the second resistor is a fixed resistor, and the other resistor is a variable resistor.

6. The device according to claim 2, wherein at least one of the first resistor and the second resistor is a resistive random access memory.

7. The device according to claim 2, wherein in case of the straight connection, each of the M cross switches connects the first terminal with the positive-side terminal, and the second terminal with the negative-side terminal, and in case of the reverse connection, each of the M cross switches connects the first terminal with the negative-side terminal, and the second terminal with the positive-side terminal.

8. The device according to claim 1, wherein the positive-side current source includes L first FETs, gates of the L first FETs are commonly connected, sources of the L first FETs are connected to a second reference potential, and drains of the L first FETs are connected to the gate and the positive-side terminal, the negative-side current source includes L second FETs, and gates of the L second FETs are commonly connected, sources of the L second FETs are connected to the second reference potential, and drains of the L second FETs are connected to the gate and the negative-side terminal.

9. The device according to claim 8, wherein the L first FETs and the L second FETs have identical characteristics.

10. The device according to claim 8, wherein the positive-side current source outputs a voltage of the positive-side terminal as the first voltage, and the negative-side current source outputs a voltage of the negative-side terminal as the second voltage.

11. The device according to claim 1, wherein when the first voltage is smaller than the second voltage, the comparator outputs the output signal having a first value, and when the first voltage is equal to or larger than the second voltage, the comparator outputs the output signal having a second value.

12. The device according to claim 1, further comprising a selector configured to select any one of N word addresses, wherein the coefficient memory unit includes the M cells for N sets corresponding respectively to the N word addresses, each of the M cells further includes a first switch configured to switch over connection or disconnection between the first resistor and the first terminal or between the first resistor and the first reference potential, and a second switch configured to switch over connection or disconnection between the second resistor and the second terminal or between the second resistor and the first reference potential, and the selector connects between the first switch and the second switch included in a cell corresponding to a selected word address, and disconnects the first switch and the second switch from each other included in other cells.

* * * * *